United States Patent
Chou et al.

(10) Patent No.: US 9,297,501 B2
(45) Date of Patent: *Mar. 29, 2016

(54) ILLUMINANT DEVICE

(71) Applicant: INTERLIGHT OPTOTECH CORPORATION, Taoyuang (TW)

(72) Inventors: Hsi-Yan Chou, Taoyuang (TW); Yu-Chou Hu, Taoyuang (TW); Fu-Chen Liu, Taoyuang (TW)

(73) Assignee: INTERLIGHT OPTOTECH CORPORATION, Yangmei, Taoyuan County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/744,987

(22) Filed: Jun. 19, 2015

(65) Prior Publication Data

US 2015/0285441 A1 Oct. 8, 2015

Related U.S. Application Data

(63) Continuation of application No. 13/656,748, filed on Oct. 22, 2012, now abandoned.

(30) Foreign Application Priority Data

May 11, 2012 (TW) .............................. 101209042 U (51) Int. Cl.

| F21V 23/00 | (2015.01) |
|---|---|
| F21K 99/00 | (2010.01) |
| F21V 29/77 | (2015.01) |
| F21V 23/06 | (2006.01) |
| F21V 19/00 | (2006.01) |
| F21Y 103/02 | (2006.01) |
| F21V 29/74 | (2015.01) |
| F21Y 101/02 | (2006.01) |

(52) U.S. Cl.
CPC ............... *F21K 9/1355* (2013.01); *F21K 9/135* (2013.01); *F21K 9/56* (2013.01); *F21V 23/002* (2013.01); *F21V 23/005* (2013.01); *F21V 23/06* (2013.01); *F21V 29/773* (2015.01); *F21V 19/0055* (2013.01); *F21V 29/745* (2015.01); *F21Y 2101/02* (2013.01); *F21Y 2103/022* (2013.01)

(58) Field of Classification Search
CPC ... H01L 33/54; Y10S 362/80; F21Y 2101/02; F21V 23/003; F21V 19/006; F21K 9/30; F21K 9/13

See application file for complete search history.

(56) References Cited

U.S. PATENT DOCUMENTS

| 2003/0021117 A1 | 1/2003 | Chan | |
| 2007/0121326 A1* | 5/2007 | Nall et al. | ...................... 362/294 |
| 2010/0097811 A1* | 4/2010 | Betsuda | ........................ 362/362 |
| 2010/0141144 A1 | 6/2010 | Hofmann et al. | |

(Continued)

*Primary Examiner* — Julie Bannan
(74) *Attorney, Agent, or Firm* — Muncy, Geissler, Olds & Lowe PC (57) ABSTRACT

An illuminant device includes a housing, a circuit board, a plurality of LED dies, a light-transmitting layer, a controlling and driving module and a conductive connector. One end of the housing has a carrying part. The circuit board is disposed on the carrying part and has a circuit layer. The LED dies are placed on the circuit board and electrically connected to the circuit layer. The light-transmitting layer is circularly disposed on the circuit board and covering the LED dies. The controlling and driving module is placed on the circuit board and electrically connected to the circuit layer. The conductive connector is assembled with the other end of the housing and electrically connected to the circuit layer.

18 Claims, 7 Drawing Sheets

(56) References Cited

U.S. PATENT DOCUMENTS

| | | | |
|---|---|---|---|
| 2010/0302758 A1* | 12/2010 | Wang | ............................ 362/20 |
| 2010/0328938 A1 | 12/2010 | Chen et al. | |
| 2011/0044039 A1 | 2/2011 | Chung et al. | |
| 2011/0128730 A1 | 6/2011 | Chiu | |
| 2011/0255278 A1 | 10/2011 | Dassanayake et al. | |
| 2012/0057344 A1 | 3/2012 | Wang | |
| 2012/0187865 A1* | 7/2012 | Chung | ............... H05B 33/0827 315/294 |
| 2013/0077285 A1 | 3/2013 | Isogai et al. | |

* cited by examiner

ILLUMINANT DEVICE

This application is based on and claims the benefit of Taiwan Application No. 101209042 filed May 11, 2012 the entire disclosure of which is incorporated by reference herein.

BACKGROUND OF THE INVENTION

1. Field of the Invention

The present invention relates to an illuminant device, and especially to an illuminant device using light emitting diode as light source.

2. Description of Prior Art

Light emitting diodes (LEDs) have the advantages of small volume, long lifetime, difficulty damage, without mercury and lower power consumption. They are gradually replacing the fluorescent tubes and incandescent lamps and widely used in indoor and outdoor lighting and decorative lighting.

Figure 1:
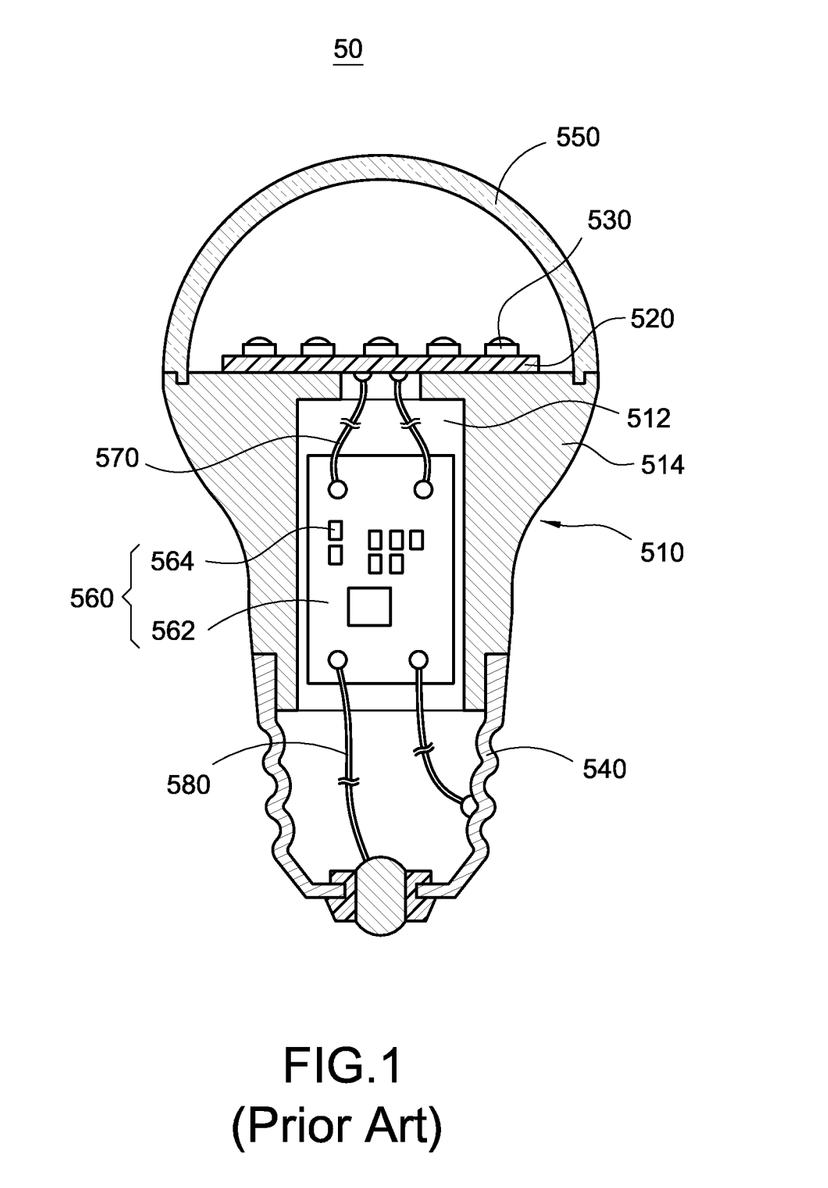
FIG. 1 is a sectional view of a conventional LED lamp.

Reference is made to FIG. 1, which is a sectional view of a conventional LED lamp. The LED lamp 50 includes a housing 510, a first circuit board 520, a plurality of LEDs 530, a conductive connector 540, a lamp shade 550 and a controlling and driving module 560. The housing 510 has an accommodating space 512 and a plurality of fins 514 disposed around the accommodating space 512 and used for enhancing heat-dissipating effect.

The first circuit board 520 is disposed at one end of the housing 510. The LEDs 530 are placed on the first circuit board 520 and electrically connected thereto. The conductive connector 540 is connected to the other end of the housing 510 which is opposite to where the first circuit board 520 is disposed. The lamp shade 550 is disposed in front of the LEDs 530 such that the LEDs 530 are arranged between the lamp shade 550 and the housing 510.

The controlling and driving module 560, which includes a second circuit board 562 and a plurality of electrical elements 564, is located within the accommodating space 512. The electrical elements 564 are placed on the second circuit board 562 and collectively constructing power modulating circuit and controlling circuit. The controlling and driving module 560 is electrically connected to the first circuit board 520 via multiple wires 570, and electrically connected to the conductive connector 540 via multiple power lines 580.

In the practical application, the first circuit board 520 for mounting the LEDs 530 and the second circuit board 562 for mounting the electrical elements 564 are respectively assembled with the housing 510, and then the first circuit board 520 and the second circuit board 562 are electrically connected via the wires 570. However, the manufacturing procedures of assembling the LED lamp 50 are complicated and manufacturing time is longer.

In addition, the second circuit board 562 and the electrical elements 564 of the controlling and driving module 560 have predestinated volume, such that the volume of the accommodating space 512 cannot be reduced, and the volume of the housing 510 can also not be effectively reduced.

SUMMARY OF THE INVENTION

It is an object to provide an illuminant device, which has advantages of easily manufacturing and small volume.

An illuminant device includes a housing, a circuit board, a plurality of LEDs, a transmitting layer, a controlling and driving module and a conductive connector. One end of the housing has a carrying part, the circuit board is disposed on the carrying part and has a circuit layer. The LEDs are placed on the circuit board and electrically connected to the circuit layer. The light-transmitting is circularly disposed on the circuit board and covers the LEDs. The controlling and driving module placed on the circuit and electrically connected to the circuit layer. The conductive connector is assembled with the other end of the housing.

The LED dies and the controlling and driving module of the illuminant device according to the present invention are respectively placed on the circuit board and electrically connected to the circuit layer, so that the circuit board for placing the controlling and driving module according to the conventional LED lamp is omitted. In addition, the volume of the accommodating space can be substantially reduced, and then the volume of the housing is also reduced. Furthermore, the electrical element dies and the LED dies are simultaneously proceeded die attachment and wire bonding procedure, which can substantially reduce manufacturing time and procedure.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

A preferred embodiment of the present invention will be described with reference to the drawings.

Figure 2:
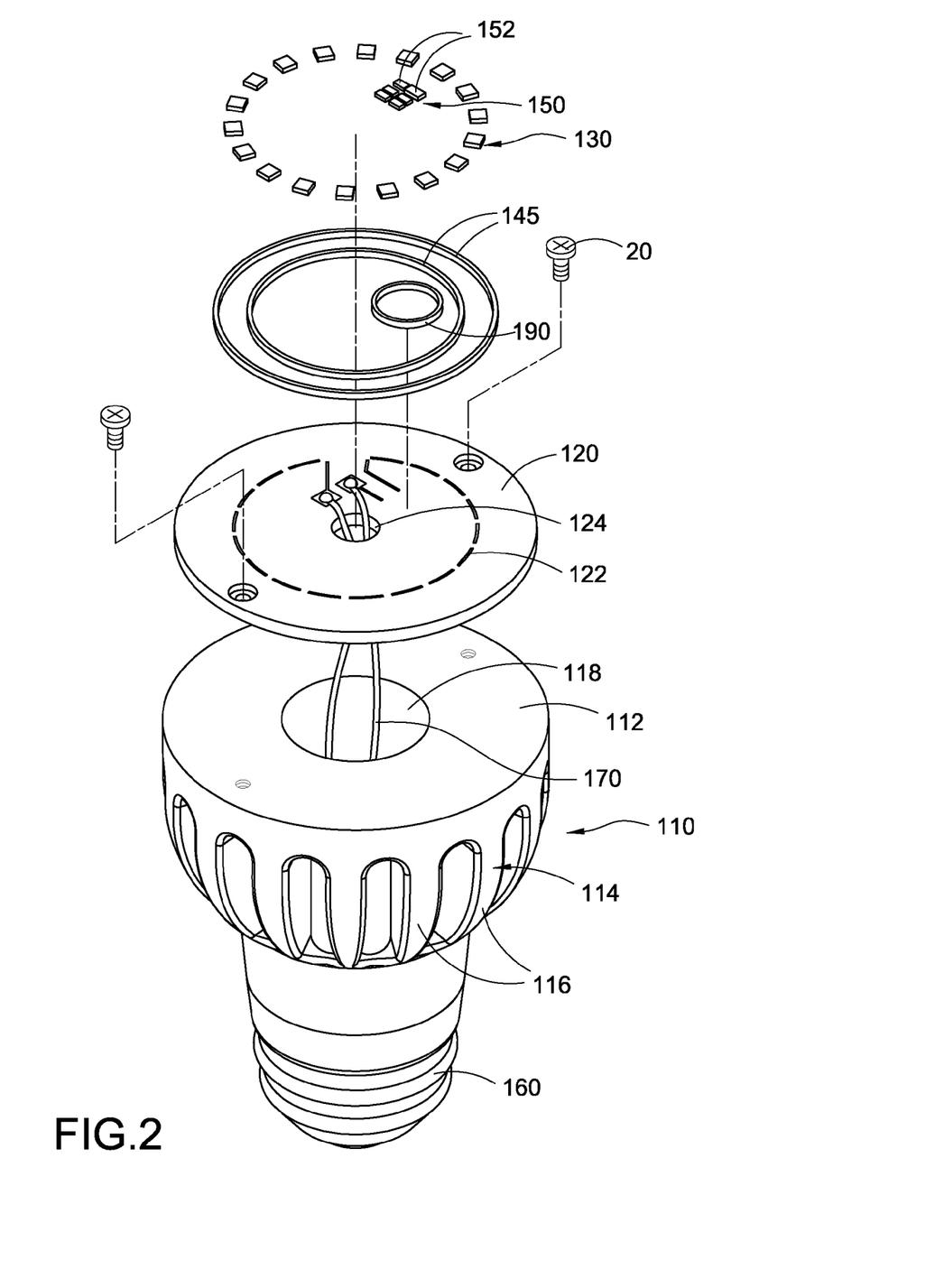
FIG. 2 is a partially perspective view of an illuminant device according to a first embodiment of the present invention.
Figure 3:
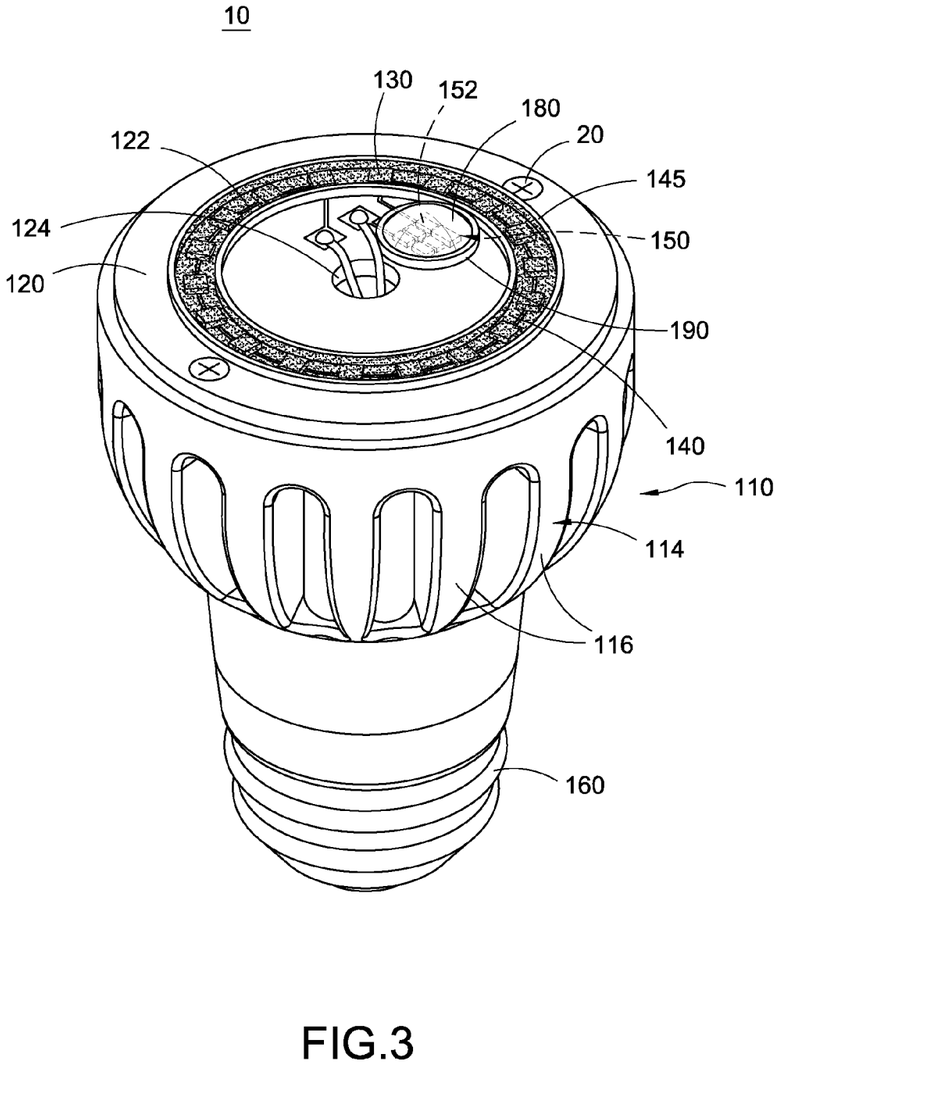
FIG. 3 is an assemble view of the illuminant device according to a first embodiment of the present invention.
Figure 4:
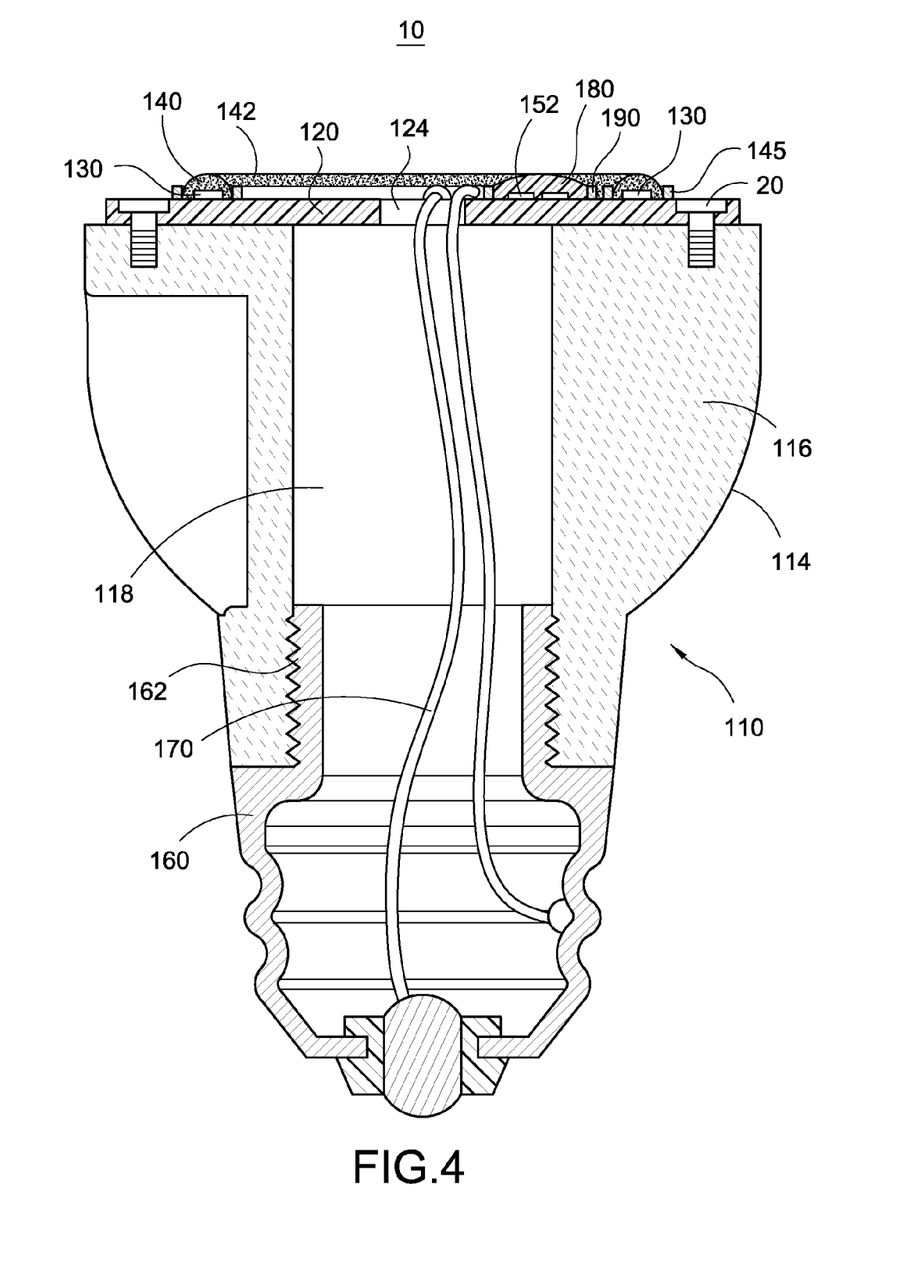
FIG. 4 is a sectional view of the illuminant device according to a first embodiment of the present invention.

Referring to FIG. 2, FIG. 3 and FIG. 4, FIG. 2 is a partially perspective view of an illuminant device according to a first embodiment of the present invention, FIG. 3 is a assemble view of the illuminant device according to a first embodiment of the present invention, and FIG. 4 is a sectional view of the an illuminant device according to a first embodiment of the present invention. The illuminant device 10 includes a housing 110, a circuit board 120, a plurality of light emitting diode (LED) dies 130, a light-transmitting layer 140, a controlling and driving module 150 and a conductive connector 160.

The housing 110 has a substantially poculiform (cup-shaped) profile and includes a carrying body 112 for carrying the circuit board 120. The carrying body 112 is preferably disposed on one end of the housing 110 which has lager diameter. The housing 110 is made of metal, for example aluminum, for quickly conductive heat generated from the LED dies 130 and the controlling and driving module 150. In the practical application, the housing 110 may also be made of ceramic or thermal-conductive plastic, which has thermal conductive property as well as electrically isolating property.

In addition, a plurality of fins 116 are radially extending from an external surface 114 of the housing 110 for increasing the area contacted with air, and then enhance heat-dissipating effect of the illuminant device 10. Furthermore, the center of the housing 110 includes an accommodating space 118.

The circuit board 120 is disposed on the carrying part 112 and fastened thereon via a plurality of fixing elements 20. In this embodiment, the amount of the fixing elements 20 is, for example, two. The circuit board 120 has a circuit layer 122 (as shown in FIG. 2) made of cupper or other electrically conductive material. The circuit board 120 may be print circuit board (PCB), metal core PCB, ceramic PCB or composite material PCB. A through hole 124 is formed on the circuit board 120, and in this embodiment, the through hole 124 is, for example, formed at the center on the circuit board 120.

Figure 5A:
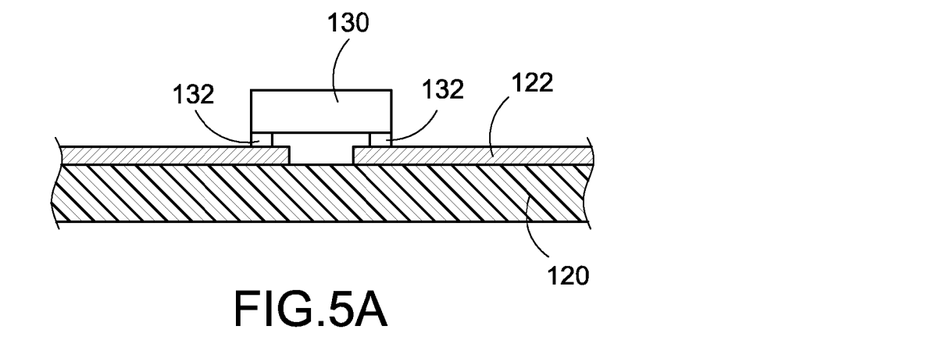
FIG. 5A to FIG. 5C are schematic views of electrically connection between LED dies and circuit layer.
Figure 5B:
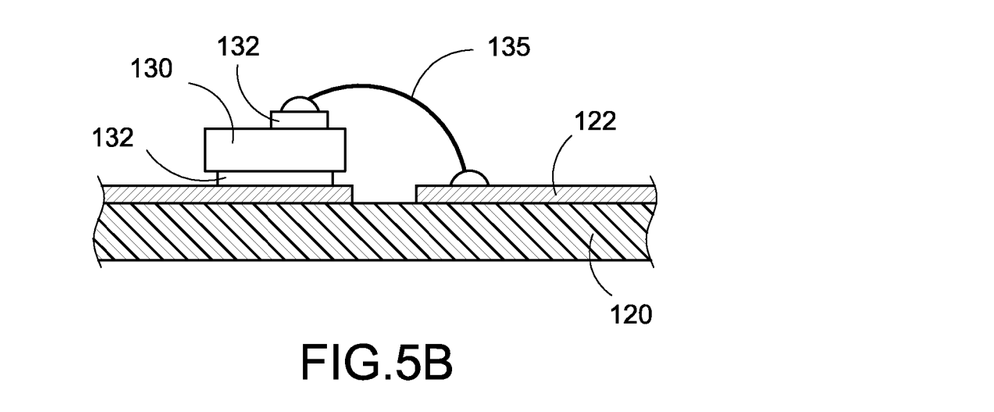
Figure 5C:
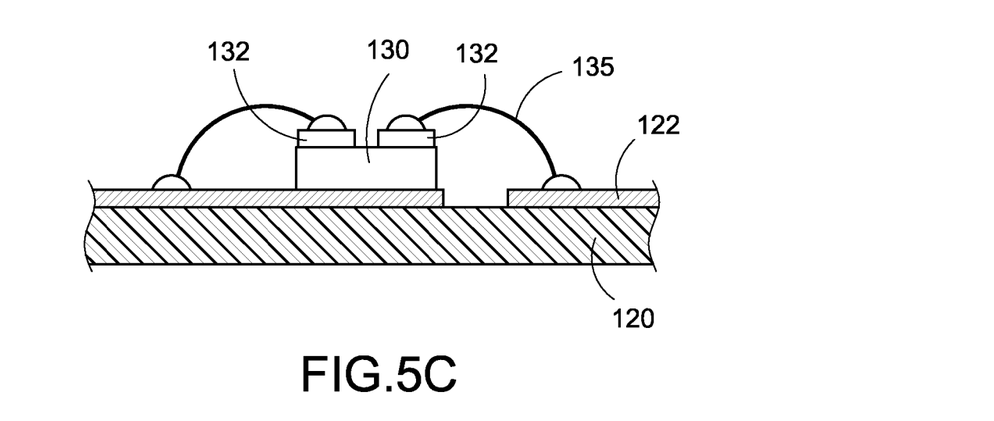

The LED dies 130 are placed on the circuit board 120, and attached on the circuit board 120 by die attachment process. The attaching material located between the LED dies 130 and the circuit board 120 may be silver adhesive, solder paste or gold-tin solder. The LED dies 130 are electrically connected to the circuit layer 122. The LED dies 130 may be flip-chip packaged, and two electrodes of each LED die 130 are directly and electrically connected to the circuit layer 122, as shown in FIG. 5A. However, the LED dies 130 may be vertical packaged, and one end of a bonding wire 135, which formed by wire bonding process, is connected to one electrode 132 of each LED die 130, the other end of the bonding wire 135 is connected to the circuit layer 122, and the other electrode 132 is directly and electrically connected to the circuit layer 122, as shown in FIG. 5B. Also, the LED dies 130 may be horizontal packaged, and two bonding wires 135 connected to two electrodes 132 of each LED dies 130 and the circuit layer 122, as shown in FIG. 5C.

Figure 6:
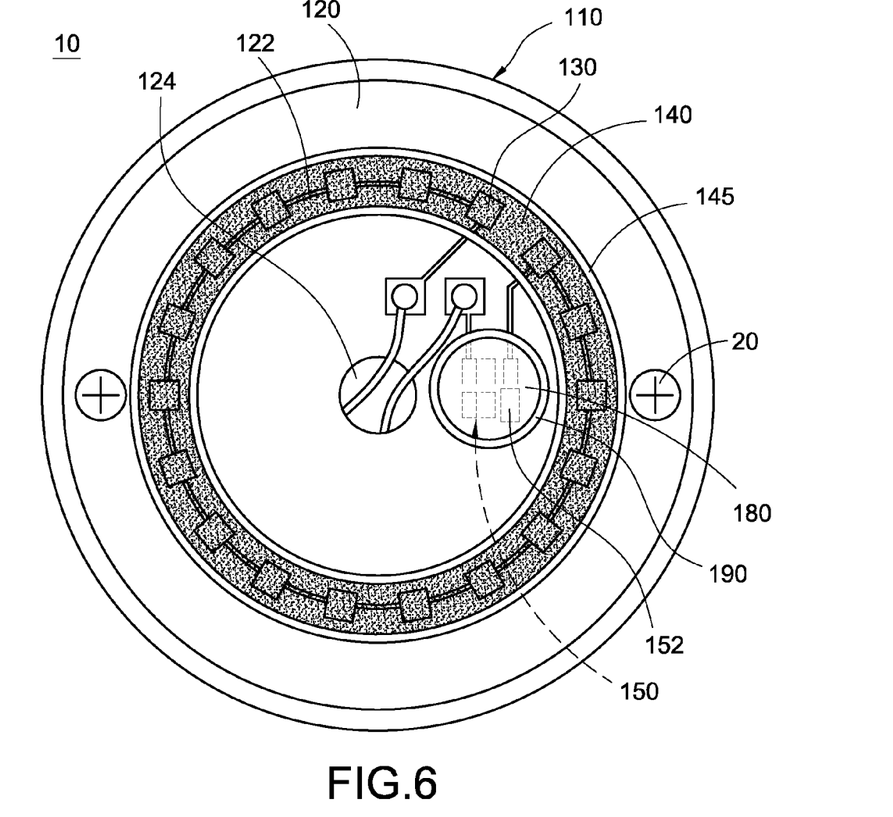
FIG. 6 is a top view of the illuminant device according to a first embodiment of the present invention.

Reference is made to FIG. 6, which is a top view of the illuminant device according to the first embodiment of the present invention. In this embodiment, the number of the LED dies 130 is, for example, 18. The LED dies 130 are arranged on the circuit board 120 in a circular manner. In preferably, the LED dies 130 are arranged on the circuit board 120 with the same interval therebetween, thus the uniformity of light emitted by the illuminant device 10 can be enhanced. In the practical application, the arrangement of the LED dies 130 may be adjusted according to demand light intensity distribution.

Figure 7:
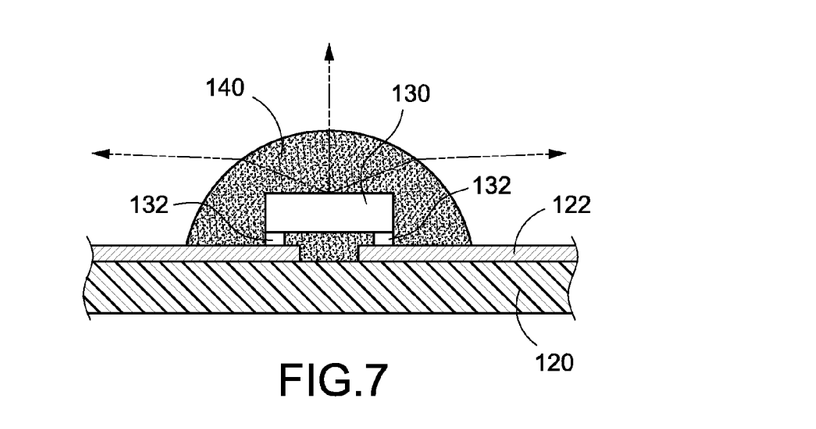
FIG. 7 is a schematic view of light passes through light-transmitting layer.

With reference again to FIG. 4 and FIG. 6, the light-transmitting layer 140 is disposed on the circuit board 120 and of circular shape. The light-transmitting layer 140 also covers the LED dies 130 to prevent the LED dies 130 from damage or reducing illuminant effect which is caused by dust attaching to the LED dies 130 and moisture permeating into LED dies 130. The light-transmitting layer 140 further protects the bonding wires 135 connected to the LED dies 130 and the circuit layer 122 from breaking caused by compression or collision. In this embodiment, the profile of the light-transmitting layer 140 covering the LED dies 130 is of arc-shape, which can enlarge light-projecting angle of light passing therethrough, as shown in FIG. 7. In FIG. 7, each LED die 130 is, for example, electrically connected to the circuit layer 132 by flip chip technology. In addition, the light-transmitting layer 140 circularly covers the LED dies 130. However, the light-transmitting layer 140 can cover the LED dies 130 in a polygon circular manner or irregular circular manner. The light-transmitting layer 140 may be epoxy, silicone resin or other light-transparent material with electrically isolating property.

The illuminant device 10 may also include two dams 145. The dams 145 are respectively disposed on the circuit board 130 and at two sides of the LED dies 130 before disposing the light-transmitting layer 120 to provide space-limiting, which can enhance accuracy of disposing the light-transmitting layer 140, and effectively control the shape thereof.

The light-transmitting layer 140 further includes a wavelength-converting matter 142 disposed therein. The wavelength-converting matter 142 is excited by partial light emitted from the LED dies 130 and then converts the light into a wavelength-converted light, which is to be mixed with other light emitted from the LED dies 130 to generate a demanded light. The wavelength-converting matter 142 is phosphor or quantum dot phosphor.

The controlling and driving module 150 including a plurality of electrical element dies 152 is placed on the circuit board 120. The electrical element dies 152 are placed on the circuit board 120 and mounted on the circuit board 120 via die attachment. The electrical element dies 152 are electrically connected to the circuit layer 122 via wire bonding. The electrically element dies 152 may electrically connect to the circuit layer 122 by flip chip (as shown in FIG. 5A) technology, or the electrical element dies 152 may electrically connect to the circuit layer 122 via at least one bonding wire (as shown in FIGS. 5B and 5C). In the practical application, the electrical element dies 152 and the LED dies 130 are simultaneously mounted on the circuit board 120 by die attachment procedure, and electrically connected to the circuit layer 122 by wire bonding procedure. The electrical element dies 152 may be resistors, capacitors, diodes or other active component or passive component, and collectively construct power modulating circuit, such as rectification, filter or buck-booster voltage, and controlling circuit, such as dimming, for driving and controlling the LED dies 130. In this embodiment, the LED dies 130 are placed at fringe of the circuit board 120 and encloses the controlling and driving module 150, so as to prevent light emitting from the LED dies 130 from being blocked by the controlling and driving module 150 and uneven light distribution. In the practical application, the controlling and driving module 150 may be as system on chip package.

With reference again to FIG. 3 and FIG. 6, the illuminant device 10 still includes a protecting layer 180. The protecting layer 180, made of transparent or opaque material, covers the controlling and driving module 150 to prevent dust from attaching to the controlling and driving module 150 and prevent moisture from permeating into the controlling and driving module 150. The protecting layer 180 also protects the bonding wires connected between each electrically element dies 152 and the circuit layer 122 to prevent the bonding wires from breaking by compress or colliding. The illuminant device 10 may also include a surrounding wall 190. The surrounding wall 190 surrounds the controlling and driving module 150 to provide space-limiting, which can enhance accuracy of disposing the protecting layer 180, and effectively control the shape thereof.

With reference again to FIG. 2 and FIG. 4, the conductive connector 160 is assembled with the other end of the housing 110. In this embodiment, the conductive connector 160 is, for example, screwed to the housing 110 via external thread 162. The conductive connector 160 is connected to an external lamp holder (not shown) and then a power, such as a 110V wall-socket alternating power source, provided by the external lamp holder can transmit to the illuminant device 10. In this embodiment, the conductive connector 160 is, for example, screw socket. However, in the practical application, the conductive connector 160 may be modulated according to application field and standard of lamp holders.

The illuminant device 10 still includes a plurality of power lines 170. In this embodiment, number of the power lines 170 is, for example, two. The power lines 170 are located within the accommodating space 118, one end of each power lines 170 is connected to the conductive connector 160, and the other end of each power lines 170 is connected to the circuit layer 122 via the through hole 124, such that the power provided by the external lamp holder is transmitted to the circuit layer 122 via the conductive connector 160 and the power lines 170, and driving the controlling and driving module 150 and the LED dies 130.

Figure 8:
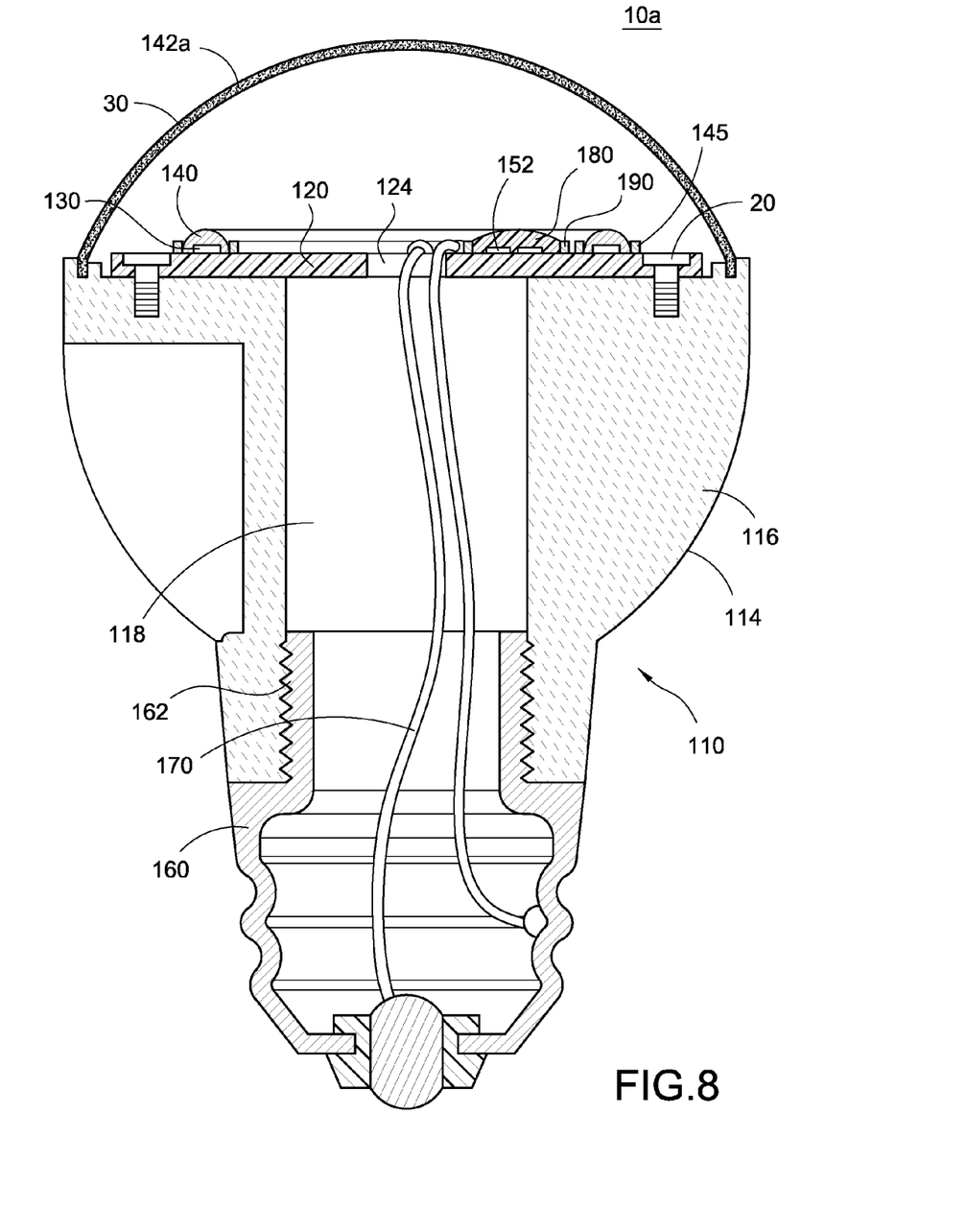
FIG. 8 is a sectional view of an illuminant device according to a second embodiment of the present invention.

Reference is made to FIG. 8, which is a sectional view of an illuminant device according to a second embodiment of the present invention. The illuminant device 10a is similar to the illuminant device 10 mentioned above, and the same reference numbers are used in the drawings and the description to refer to the same parts. It should be noted that the illuminant device 10a further includes a lamp shade 30, and that a wavelength-converting matter 142a is disposed within the lamp shade 30 rather than disposed within the light-transmitting layer 140.

The lamp shade 30 is assembled with the housing 110, such that the circuit board 120, the LED dies 130 and the controlling and driving module 150 are arranged between the housing 110 and the lamp shade 30 for providing isolating protection. The lamp shade 30 may be made of light-transmitting material such as resin, plastic or glass, and selected to be transparent or translucent. In this embodiment, the lamp shade 30 is of hemisphere shape. In the practical application, however, the lamp shade 30 may be of other special shape according to practical applications.

In FIG. 8, the wavelength-converting matter 142a is phosphor or quantum dot phosphor. The wavelength-converting matter 142a is excited by partial light emitted from the LED dies 130 and transmitted to the lamp shade 30, and then converts the light into a wavelength-converted light, which is to be mixed with other light emitted from the LED dies 130 to generate a demanded light.

To sum up, the LED dies 130 and the controlling and driving module 150 of the illuminant device 10, 10a according to the present invention are respectively placed on the circuit board 120 and electrically connected to the circuit layer 122, so that the circuit board 120 for placing the controlling and driving module 150 in the conventional LED lamp is omitted. In addition, the volume of the accommodating space 118 can be substantially reduced, and then the volume of the housing is also reduced. Furthermore, the electrical element dies 152 and the LED dies 130 are simultaneously proceeded die attachment and wire bonding procedure, which can substantially reduce manufacturing time and procedure.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An illuminant device comprising:
a circuit board having a circuit layer;
a plurality of LED dies arranged in a loop configuration on the circuit board and electrically connected to the circuit layer;
a light-transmitting layer comprising a wavelength-converting matter and covering the plurality of LED dies in a closed loop configuration;
an outer dam surrounding the light-transmitting layer; and
an inner dam physically separated from the outer dam and surrounded by the light-transmitting layer,
wherein the light transmitting layer is higher than the outer dam, a controlling and driving module placed on the circuit board and electrically connected to the circuit layer, and wherein the plurality of LED dies surrounds the controlling and driving module.

2. The illuminant device of claim 1, further comprising a protecting layer covering the controlling and driving module.

3. The illuminant device of claim 1, further comprising a wall surrounding the controlling and driving module.

4. The illuminant device of claim 1, further comprising a through hole penetrating the circuit board.

5. The illuminant device of claim 4, wherein the through hole is substantially arranged at a center of the circuit board.

6. The illuminant device of claim 4, wherein the through hole is closer to a controlling and driving module than the plurality of LED dies.

7. The illuminant device of claim 1, wherein the light-transmitting layer is arranged on the circuit board in a bulge configuration.

8. The illuminant device of claim 1, wherein the outer dam and the inner dam are respectively arranged in a concentric configuration.

9. The illuminant device of claim 1, further comprising a bonding wire connecting one of the plurality of LED dies with the circuit layer, and covered by the light-transmitting layer.

10. The illuminant device of claim 1, wherein the plurality of LED dies is lined up in a row.

11. The illuminant device of claim 1, wherein the plurality of LED dies is arranged in a substantially identical spacing.

12. The illuminant device of claim 1, wherein the light-transmitting layer is substantially arranged in a polygonal circular configuration.

13. The illuminant device of claim 1, further comprising a housing supporting the circuit board.

14. The illuminant device of claim 13, wherein the housing comprises an external surface having a plurality of fins.

15. The illuminant device of claim 13, wherein the housing comprises an accommodating space.

16. The illuminant device of claim 13, further comprising a conductive connector assembled with the housing.

17. The illuminant device of claim 16, further comprising a power line electrically connecting the circuit board with the conductive connector.

18. The illuminant device of claim 1, wherein the closed loop configuration comprises a continuous geometric shape.

* * * * *